United States Patent [19]
Marrs

[11] Patent Number: 5,485,037
[45] Date of Patent: Jan. 16, 1996

[54] SEMICONDUCTOR DEVICE HAVING A THERMAL DISSIPATOR AND ELECTROMAGNETIC SHIELDING

[75] Inventor: Robert C. Marrs, Scottsdale, Ariz.

[73] Assignee: Amkor Electronics, Inc., Chandler, Ariz.

[21] Appl. No.: 410,381

[22] Filed: Mar. 27, 1995

Related U.S. Application Data

[63] Continuation of Ser. No. 48,888, Apr. 12, 1993, abandoned.

[51] Int. Cl.$^6$ .......................... H01L 23/02; H01L 39/02; H02B 1/00; H02K 5/00
[52] U.S. Cl. .................. 257/712; 257/713; 257/787; 257/796; 257/659; 257/660; 361/688; 361/702; 361/704
[58] Field of Search ...................... 257/712, 713, 257/717, 718, 719, 737, 738, 774, 787, 791, 796, 659, 660; 361/608, 702, 704

[56] References Cited

U.S. PATENT DOCUMENTS

| | | | |
|---|---|---|---|
| 3,628,105 | 12/1971 | Sakai et al. | 257/712 |
| 4,410,905 | 10/1983 | Grabbe | 357/80 |
| 4,541,005 | 9/1985 | Hunter et al. | 357/81 |
| 4,631,820 | 12/1986 | Harada et al. | 29/840 |
| 4,769,344 | 9/1988 | Sakai et al. | 437/216 |
| 4,835,120 | 5/1989 | Mallik et al. | 437/209 |
| 4,891,687 | 1/1990 | Mallik et al. | 357/70 |
| 4,942,454 | 7/1990 | Mori et al. | 257/796 |
| 4,975,761 | 12/1990 | Chu | 357/72 |
| 4,994,936 | 2/1991 | Hernandez | 361/306 |
| 5,006,919 | 4/1991 | Disko | 357/72 |

FOREIGN PATENT DOCUMENTS

| | | | |
|---|---|---|---|
| 60-77446 | 5/1985 | Japan | 257/787 |
| 1179439 | 7/1989 | Japan | 257/787 |

*Primary Examiner*—Jerome Jackson
*Assistant Examiner*—Carl Whitehead, Jr.
*Attorney, Agent, or Firm*—Skjerven, Morrill, MacPherson, Franklin & Friel

[57] ABSTRACT

An inexpensive packaged integrated circuit with improved heat dissipative capacity and electrical performance. In one embodiment, the packaged integrated circuit includes a semiconductor die, a plurality of electrically conductive package leads, a thermal induction plate and a plurality of electrically conductive bond wires. A surface of the thermal induction plate may remain exposed outside the package. The thermal induction plate reduces package lead inductance and provides shielding of electromagnetic radiation that can cause electromagnetic interference. Preferably, holes are formed through the thermal induction plate to enhance flow of the package material during formation of a package and provide interlocking of the package to the remainder of the integrated circuit. In another embodiment, the packaged integrated circuit further includes a heat sink having a surface exposed to the exterior of the package. The heat sink may also perform an electrical function such as, for instance, acting as a power or ground plane. One or more generally conductive layers can be added to either of the above embodiments. The generally conductive layer or layers may be used to provide ground planes, power planes and/or electrically conductive traces for signal routing or an interconnect ring. The generally conductive layer or layers enable uniform power and ground supplies to be provided to the circuitry formed on the die, reduce package lead inductance, provide decoupling capacitances that reduce switching noise and crosstalk, and allow increased flexibility in the placement of particular circuit components.

18 Claims, 12 Drawing Sheets

SEMICONDUCTOR DEVICE HAVING A THERMAL DISSIPATOR AND ELECTROMAGNETIC SHIELDING

This application is a continuation of application Ser. No. 08/048,888, filed Apr. 12, 1993, now abandoned.

BACKGROUND OF THE INVENTION

1. Field of the Invention

This invention relates to integrated circuits including hybrid circuits and multichip modules) and, in particular, to a plastic packaged integrated circuit including semiconductor die or dice, package leads, bond wires, an optional heat sink having a surface exposed outside the plastic, and a thermal induction plate, which radiates less electromagnetic energy, has reduced electrical noise and crosstalk, and dissipates heat well.

2. Related Art

Increased semiconductor production volumes have led to the development of more cost effective integrated circuit packaging, e.g., plastic packages. However, the conventional plastic package has poor thermal conductivity, making it disadvantageous for use with modern integrated circuits which are subject to greater heat buildup than their predecessors due to increased speed of operation and/or to increased density of electrical circuitry on the integrated circuit chip. In order to provide improved thermal performance (i.e., improved dissipation of heat), some plastic packaged integrated circuits now include a metallic heat sink to aid in the removal of heat from the semiconductor die to the exterior of the package.

In addition to considerations of cost and heat dissipation, it is desirable to package an integrated circuit so as to minimize the amount of electrical noise generated. Switching noise (for instance, an inductive voltage spike that occurs on a current path as the result of rapid current switching) and crosstalk (the appearance of a spurious electrical current in a current path as a result of mutual capacitance and inductance between such current path and other nearby current paths) are two significant sources of noise in integrated circuits. In packaged integrated circuits including leads to transmit electrical signals between the integrated circuit chip and electrical components outside the package, mutual inductance and self-inductance of these package leads are particularly troublesome sources of electrical noise.

Another problem associated with packaged integrated circuits is electromagnetic interference (EMI). Electromagnetic radiation that emanates from the electrically conductive material within a conventional plastic package can interfere with nearby electronic components. It is desirable to minimize or eliminate this electromagnetic interference.

In today's packaged integrated circuits, it is desirable to include one or more generally conductive layers including electrically conductive regions and/or paths within the package for use as power, ground or routing planes. Power and ground planes enable provision of more uniform power and ground supplies to the integrated circuit chip. Routing planes allow increased flexibility in the formation of electrical connections within the packaged integrated circuit. The provision of such generally conductive layers is also desirable because, properly configured, the generally conductive layers can help reduce electrical noise. For instance, a generally conductive layer, when formed into a power or ground plane, can be used to increase decoupling capacitance, reduce the length of signal paths, and reduce capacitive and inductive coupling between adjacent signal paths in order to minimize switching noise and crosstalk.

Despite the aforementioned efforts at improving heat dissipative capacity and electrical performance, there is a continuing need for packaged integrated circuits having increased heat dissipative capacity and improved electrical characteristics such as reduced electrical noise and EMI.

SUMMARY OF THE INVENTION

According to the invention, a packaged integrated circuit includes a semiconductor die, a leadframe including a plurality of electrically conductive leads (package leads), a plurality of electrically conductive bond wires, an optional heat sink with a surface exposed outside the package, and a thermal induction plate. The thermal induction plate reduces electrical noise and crosstalk in signal paths of the packaged integrated circuit, reduces the amount of electromagnetic energy radiated from the packaged integrated circuit and helps dissipate heat away from the die enclosed in the packaged integrated circuit.

In one embodiment, electrically conductive circuitry and a plurality of electrically conductive bond pads are formed on the semiconductor die. The semiconductor die is attached to a die attach pad of the leadframe. The bond wires are used to make electrical connection between selected package leads and associated bond pads on the die. The thermal induction plate is positioned adjacent an inner portion of one side of the package leads in such a manner that the thermal induction plate is electrically isolated from the package leads.

In another embodiment according to the invention, the above packaged integrated circuit further includes a heat sink having a surface exposed outside the package. In this embodiment, the semiconductor die is attached directly to the heat sink rather than to a die attach pad. The heat sink is attached to the package leads on a side opposite that on which the thermal induction plate is positioned. In this configuration, in addition to electrical connection between package leads and bond pads, the bond wires can be used to make electrical connection between selected package leads and the heat sink, and between the heat sink and bond pads on the die.

In further embodiments according to the invention, one or more generally conductive layers are added to either of the above embodiments. The generally conductive layer or layers can be attached either between the heat sink and package leads, or between the thermal induction plate and the package leads. The generally conductive layer or layers each include either a layer of electrically conductive material or a layer of electrically insulative material in which electrically conductive regions and/or paths (traces) are formed. The package leads are attached to a side of the generally conductive layer or layers such that the package leads are electrically isolated from the generally conductive layer or layers.

Dielectric layers may be used to electrically isolate conductive components of the packaged integrated circuit according to the invention. In particular, a dielectric layer may be disposed between the heat sink and a generally conductive layer, two generally conductive layers, or a generally conductive layer and the package leads. The dielectric layer can include adhesive layers.

The generally conductive layer or layers may be used for a number of purposes. The generally conductive layer or layers may be used to create ground and/or power planes. Electrically conductive traces may be formed in the generally conductive layer or layers for signal routing or to provide a conducting bridge between inner tips of the package leads and the edge of the die.

Packaged integrated circuits according to the invention dissipate heat more effectively than prior art packaged integrated circuits. When a heat sink is included in a packaged integrated circuit according to the invention, the close connection between the semiconductor die and heat sink allows a large amount of heat to be transferred from the die to the heat sink. The heat is then transferred through the heat sink both to the package leads and to the exposed surface of the heat sink. Preferably, a surface of the heat sink is exposed outside the package. The exposed heat sink surface enables heat to be transferred away from the integrated circuit chip better than would be the case if relatively thermally insulative package material was present between the heat sink and the exterior of the package.

The thermal induction plate also helps dissipate heat from the integrated circuit chip. In one embodiment, the surface of the thermal induction plate remains exposed outside the package to improve the heat dissipation of the packaged integrated circuit according to the invention.

Preferably, holes are formed through the thermal induction plate. The holes may be of any size or shape that allow free flow of the package material during encapsulation of the integrated circuit so that air pockets (cavities) do not form in the package material. The holes also allow interlocking of the package material with the thermal induction plate to help bond the package material to the remainder of the integrated circuit and to the thermal inducation plate.

In addition to good thermal characteristics, packaged integrated circuits according to the invention have enhanced electrical performance as compared to previous packaged integrated circuits. The presence of the thermal induction plate in proximity to the package leads causes mutual inductance between the package leads and thermal induction plate, resulting in a reduction of inductance in package leads, which reduces switching noise. The presence of the thermal induction plate also reduces the capacitive coupling between adjacent signal paths, thereby reducing crosstalk. Further, the thermal induction plate reduces electromagnetic interference (EMI), an important benefit for high speed devices, by shielding electromagnetic energy radiated from within the package. Since the heat sink also provides EMI shielding, embodiments of the invention including a heat sink are particularly effective in providing a large reduction of EMI.

Further, as noted above, in some embodiments of the packaged integrated circuit according to the invention, a generally conductive layer or layers can be used to provide a ground plane, power plane, signal routing, or some combination of these functions. Provision of power and/or ground planes on the generally conductive layer or layers enables uniform power and ground supplies to be provided to the circuitry formed on the die. The presence of the generally conductive layer or layers reduces package lead inductance, which results in a reduction of electrical noise. The power and ground planes also create decoupling capacitance that reduces switching noise and crosstalk. The generally conductive layers can be formed on either side of the package leads and need not necessarily be electrically connected to the package leads or die. Electrically interconnected or not, the generally conductive layers reduce mutual inductance in the package leads and provide decoupling capacitances. Provision of signal routing on the generally conductive layer or layers allows increased flexibility in signal routing for single chip packaged integrated circuits and may be used for connecting chips and passive components in multichip or hybrid modules.

The heat sink in some embodiments of the packaged integrated circuit according to the invention may also perform an electrical function. For instance, the heat sink may be used as a power or ground plane. If the heat sink performs such an electrical function, bonding locations on the heat sink are electrically connected with bond wires to one or more bond pads on the die, and/or one or more bonding locations on the generally conductive layer, and/or one or more package leads.

DETAILED DESCRIPTION OF EMBODIMENTS OF THE INVENTION

Figure 1A:
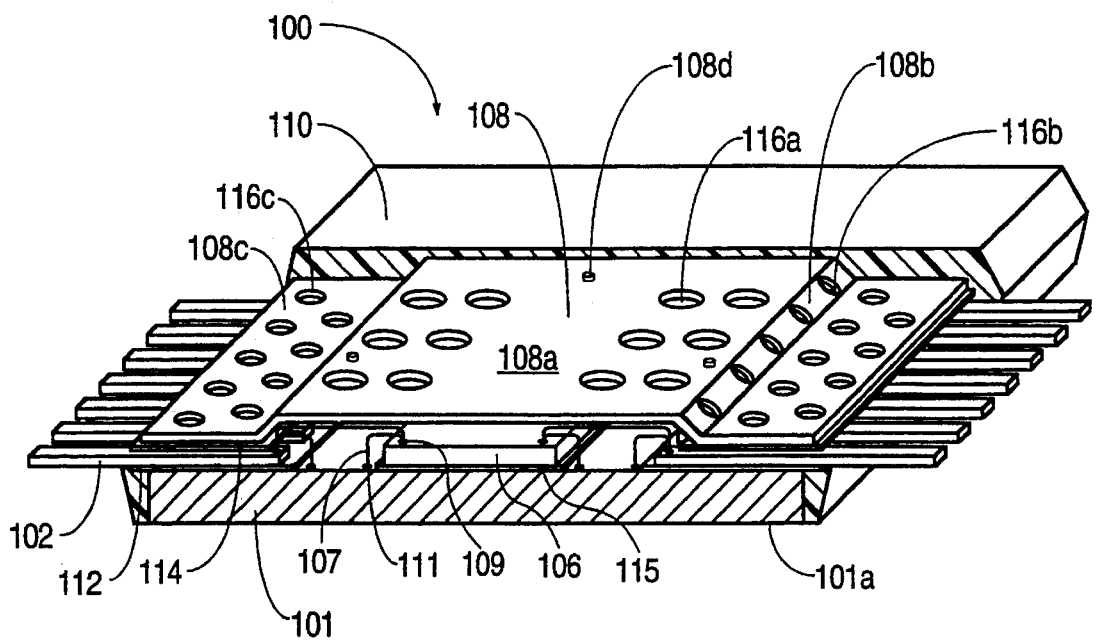
FIGS. 1A and 1B are a cutaway perspective view and a cross-sectional view, respectively, of a packaged integrated circuit according to an embodiment of the invention.
Figure 1B:
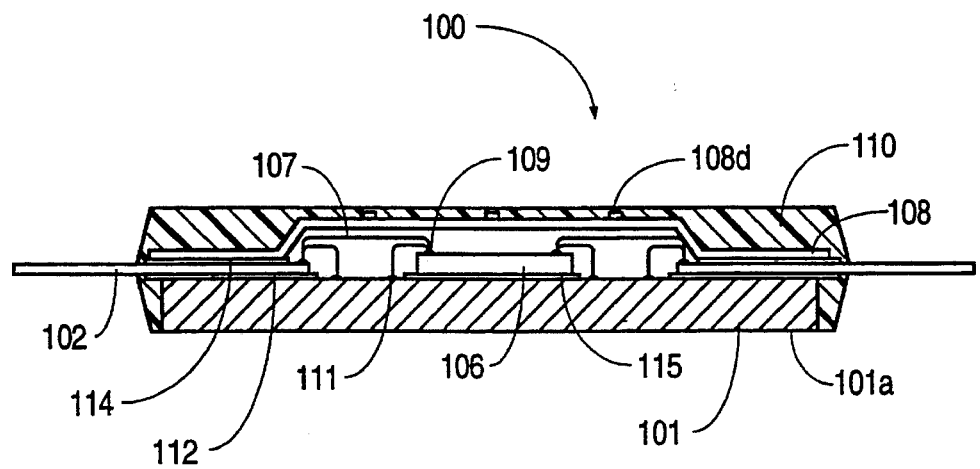

FIGS. 1A and 1B are a cutaway perspective view and a cross-sectional view, respectively, of a packaged integrated circuit 100 according to an embodiment of the invention. A semiconductor die 106 on which electrically conductive circuitry (not shown) and a plurality of electrically conductive bond pads 109 are formed is attached to a heat sink 101 with an adhesive 115. The inner portion of a surface of each of a plurality of electrically conductive package leads 102 are attached with an electrically insulative adhesive 112 to the heat sink 101 such that inner ends of the package leads 102 are near the die 106. A thermal induction plate 108 is positioned adjacent to a surface of each of the package leads 102 opposite the surface attached to the heat sink 101 such that the thermal induction plate 108 is electrically insulated from the package leads 102. Though, in FIGS. 1A and 1B, the thermal induction plate 108 is attached to the package leads 102 with an adhesive 114, the adhesive 114 does not have to be used. Instead, a dielectric layer could be positioned between the thermal induction plate 108 and the package leads 102.

The thermal induction plate 108 provides several benefits. The presence of the thermal induction plate 108 reduces the inductance in signal paths, thus reducing switching noise, and reduces the capacitive coupling between adjacent signal paths, thus reducing crosstalk. In addition, the thermal induction plate 108 shields electromagnetic energy radiated from within the packaged integrated circuit 100. The thermal induction plate 108 also helps transfer heat away from the die 106, since heat can be conducted through the package leads 102 to the thermal induction plate 108, then through the thermal induction plate 108 and, ultimately, to the exterior of the packaged integrated circuit 100.

The thermal induction plate 108 is formed with three sections 108a, 108b, 108c. Sets of holes 116a, 116b, 116c are formed through each of the sections 108a, 108b, 108c, respectively. Though the holes 116a, 116b, 116c are shown as circular, it is to be understood that the holes 116a, 116b, 116c could have another shape, e.g., elliptical, "racetrack-shaped," etc. Further, the thermal induction plate 108 can be formed with one continuous surface or can have other than three surfaces. Additionally, the thermal induction plate 108 need not have a section extending over the die 106, e.g., the thermal induction plate 108 may include only section 108c.

Electrically conductive bond wires 107 connect selected ones of the bond pads 109 on the die 106 to an inner portion of selected ones of the package leads 102 or to bonding locations 111 on the heat sink 101. Likewise, the inner portion of some of the package leads 102 may be attached to bonding locations 111 on the heat sink 101 with bond wires 107.

The semiconductor die 106, heat sink 101, thermal induction plate 108, inner portion of the package leads 102 and bond wires 107 are enclosed in an integrated circuit package 110 such as, for instance, a plastic package formed by, for instance, injection molding, transfer molding or potting. The outer portions of the package leads 102 extend outside the package 110 and allow electrical connection to be made between the semiconductor die 106 inside the package 110 and electronic components outside the package 110. The surface 101a of the heat sink 101 is exposed (excepting the possible presence of encapsulant bleed or flash, as explained below) to the exterior of the package 110. Protrusions 108d extend from the section 108a of the thermal induction plate 108 so that the protrusions 108d are exposed to the exterior of the package 110.

The adhesive 115 used to attach the semiconductor die 106 to the heat sink 101 could be either electrically insulative or electrically conductive, depending on the desired voltage biases for the heat sink 101 and substrate of the die 106. If the heat sink 101 and substrate of the die 106 are to be biased to the same voltage, then the adhesive 115 is electrically conductive; otherwise, the adhesive 115 is electrically insulative. A polyimide or epoxy adhesive (to which ceramic fill may be added, if desired, to increase thermal conductivity) may be used, for instance, as an electrically insulative adhesive. An epoxy or polymide resin to which silver fill is added may be used, for instance, as an electrically conductive adhesive.

The electrically insulative adhesive 112 used to attach the package leads 102 to the heat sink 101 can be, for instance, a polyimide with a ceramic fill that is relatively thermally conductive so that heat can be more efficiently transferred from the package leads 102 to the heat sink 101 and from there to the exterior of the package 110. The adhesive 112 extends beyond the inner end of the package leads 102. This is done to compensate for tolerances in positioning of the package leads 102 with respect to the adhesive 112 that may otherwise allow a reduction in electrical isolation (and, thus, electrical leakage) between the package leads 102 and heat sink 101. The extended adhesive 112 also relieves stress caused by the differences in coefficients of expansion of the package materials which create stress during thermal cycling of the packaged integrated circuit 100.

The thermal induction plate may be formed from, for example, copper or anodized aluminum. If copper is used, the choice of copper depends on the desired characteristics of the thermal induction plate 108. For instance, "pure" copper is relatively soft and easy to form, making production of the thermal induction plate relatively easy. Beryllium copper is not as easy to form as "pure" copper, but shears more cleanly, allowing the thermal induction plate to be separated more easily from the forming apparatus. Various types of aluminum alloys, beryllium copper, or other copper alloys, each having different electrical characteristics, may be used.

If the thermal induction plate 108 is made of copper, then it is necessary either to use an adhesive 114 that is electrically insulative to attach the thermal induction plate 108 to the package leads 102, or to dispose a dielectric layer (not shown in FIGS. 1A and 1B) between the thermal induction plate 108 and package leads 102. Since, as discussed below, it is desirable that a large amount of heat be transferred from the package leads 102 to the thermal induction plate 108, an electrically insulative, but thermally conductive, adhesive such as ceramic-filled polyimide could be used.

If the thermal induction plate 108 is made of anodized aluminum, illustratively, the thermal induction plate 108 may be black anodized aluminum 6061. Anodization increases the corrosion resistance of the thermal induction plate 108 and may be desirable for cosmetic reasons. Any adhesive 114 is acceptable, e.g., ceramic-filled epoxy resin, to attach the anodized aluminum thermal induction plate 108 to the package leads 102. Alternatively, the thermal induction plate 108 can just be placed in close proximity to the package leads 102 without being attached with the adhesive 114.

The holes 116a, 116b, 116c in the thermal induction plate 108 may be formed by etching or by a mechanical method such as stamping, cutting or drilling.

Figure 1C:
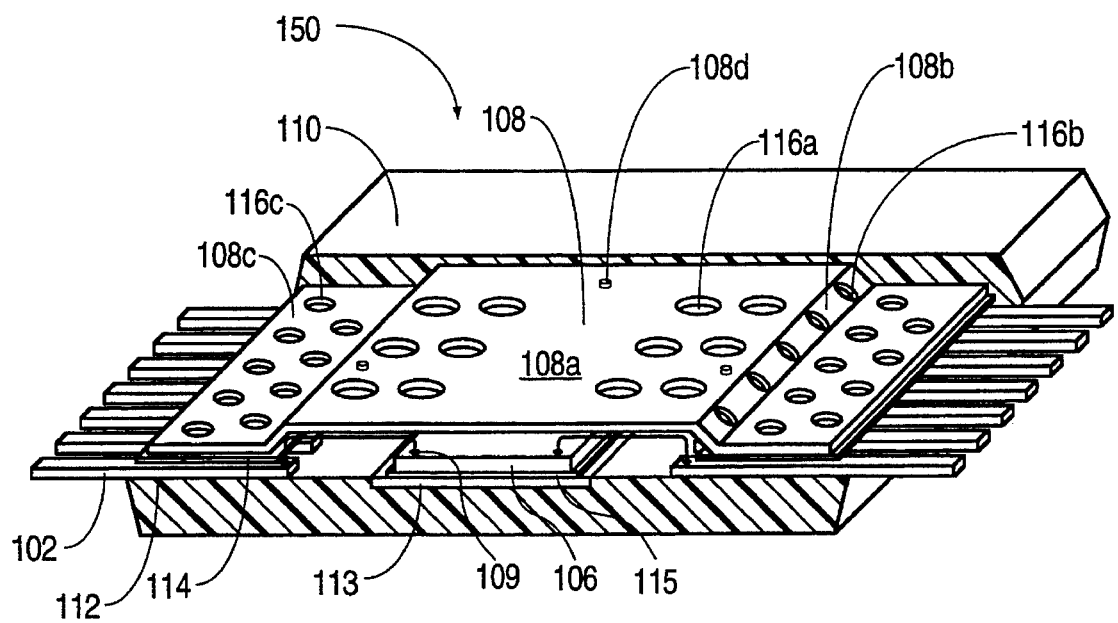
FIGS. 1C and 1D are a cutaway perspective view and a cross-sectional view, respectively, of a packaged integrated circuit according to another embodiment of the invention.
Figure 1D:
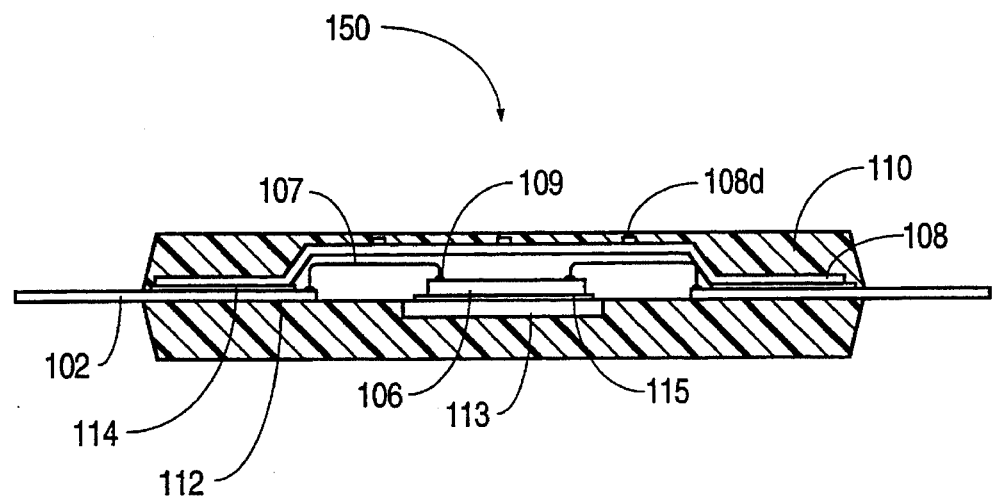

FIGS. 1C and 1D are a cutaway perspective view and a cross-sectional view, respectively, of a packaged integrated circuit 150 according to another embodiment of the invention. The packaged integrated circuit 150 is the same as the packaged integrated circuit 100 except that the heat sink 101 of the packaged integrated circuit 100 is not present in the packaged integrated circuit 150. Since the heat sink 101 is no longer present, the die 106 is mounted instead to a die attach pad 113.

Figure 2A:
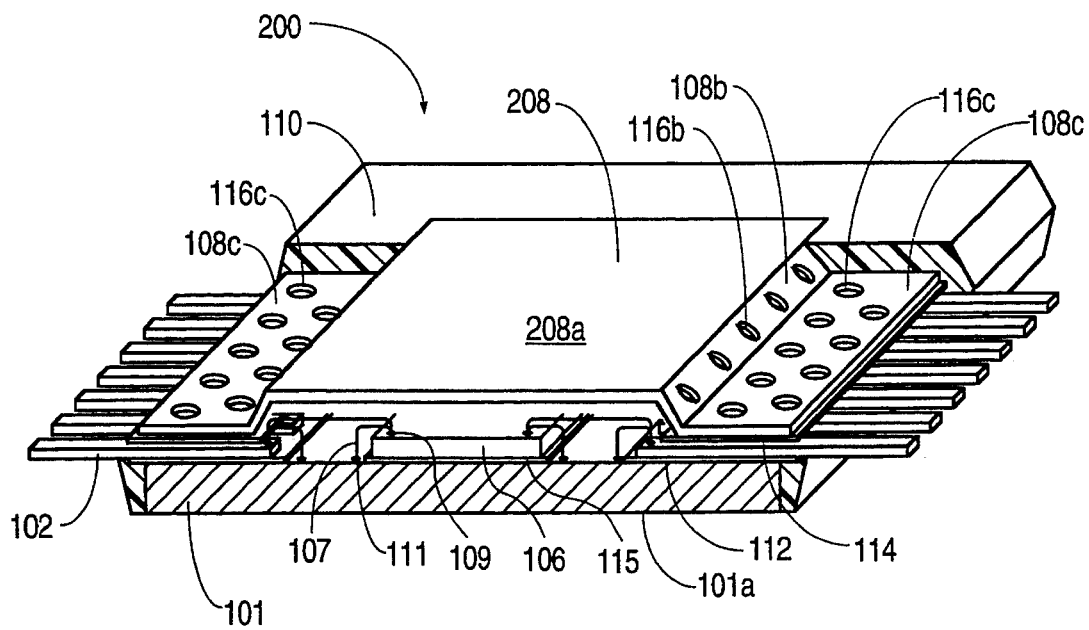
FIGS. 2A and 2B are a cutaway perspective view and a cross-sectional view, respectively, of a packaged integrated circuit according to another embodiment of the invention.
Figure 2B:
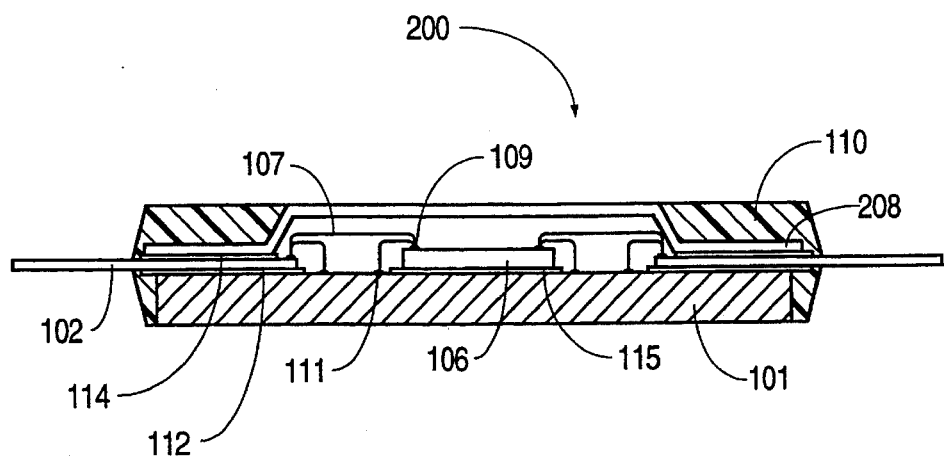

FIGS. 2A and 2B are a cutaway perspective view and a cross-sectional view, respectively, of a packaged integrated circuit 200 according to another embodiment of the invention. The packaged integrated circuit 200 is similar to the packaged integrated circuit 100 and like elements in the packaged integrated circuits 100 and 200 are indicated with the same numbers. While the thermal induction plate 108 (FIGS. 1A and 1B) has a section 108a on which protrusions 108d are formed and through which holes 116a are formed, the thermal induction plate 208 (FIGS. 2A and 2B) has a section 208a without protrusions or holes. Thus, whereas only the protrusions 108d of the thermal induction plate 108 are exposed outside the package 110 of packaged integrated circuit 100, an entire surface of section 208a of thermal induction plate 208 is exposed outside the package 110 of packaged integrated circuit 200.

Figure 2C:
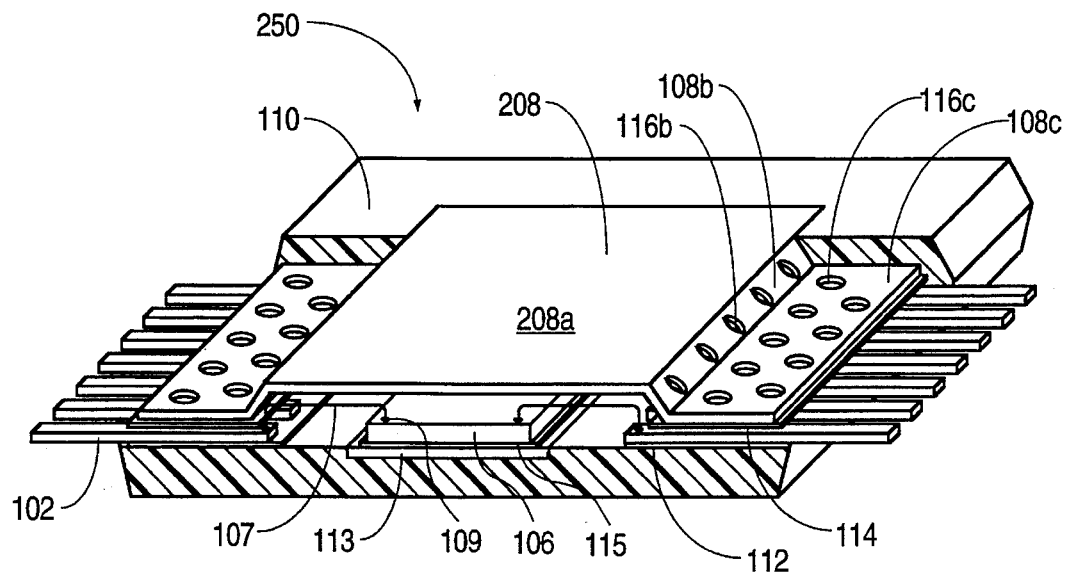
FIGS. 2C and 2D are a cutaway perspective view and a cross-sectional view, respectively, of a packaged integrated circuit according to another embodiment of the invention.
Figure 2D:
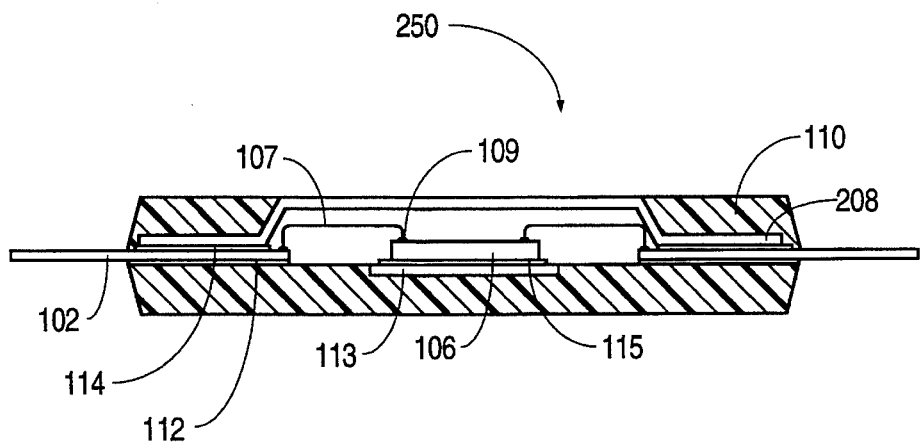

FIGS. 2C and 2D are a cutaway perspective view and a cross-sectional view, respectively, of a packaged integrated circuit 250 according to another embodiment of the invention. The packaged integrated circuit 250 is the same as the packaged integrated circuit 200 except that the heat sink 101 of the packaged integrated circuit 200 is not present in the packaged integrated circuit 250. As in FIGS. 1C and 1D, the die 106 is attached to the die attach pad 113 rather than the heat sink 101.

Figure 3A:
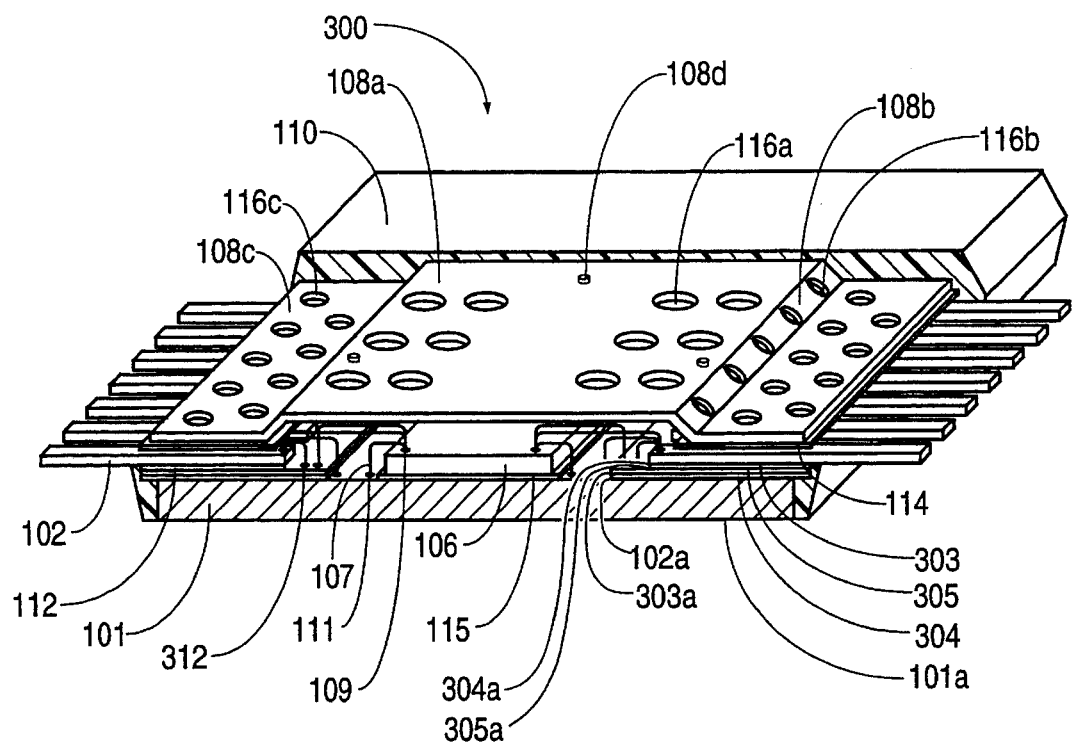
FIGS. 3A and 3B are a cutaway perspective view and a cross-sectional view, respectively, of a packaged integrated circuit according to another embodiment of the invention.
Figure 3B:
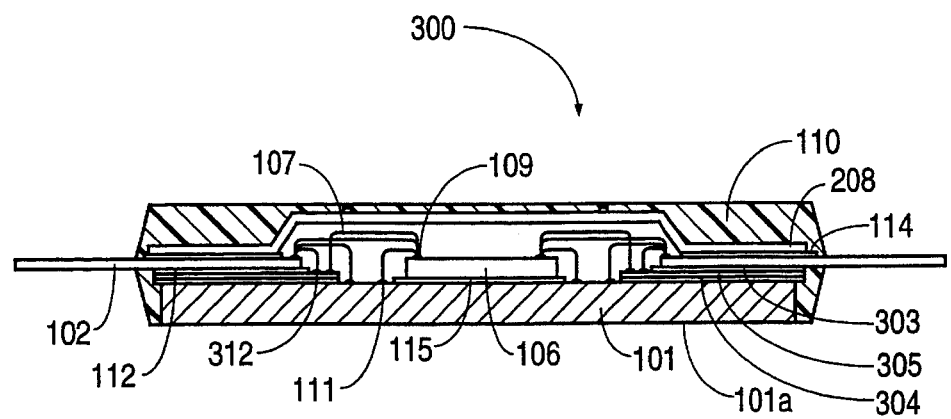

FIGS. 3A and 3B are a cutaway perspective view and a cross-sectional view, respectively, of a packaged integrated circuit 300 according to another embodiment of the invention. The packaged integrated circuit 300 is similar to the packaged integrated circuit 100 and like elements in the packaged integrated circuits 100 and 300 are indicated with the same numbers.

In the packaged integrated circuit 300, a generally conductive layer 305 has been added to the packaged integrated circuit 100 of FIGS. 1A and 1B. The generally conductive layer 305, which may be a layer of electrically conductive material or a layer of electrically insulative material in which electrically conductive regions and/or paths (traces) are formed, is attached on one side to the heat sink 101. The generally conductive layer 305 is formed around the periphery of the die 106. It is to be understood that in other embodiments of the invention, the generally conductive layer 305 can be formed such that the generally conductive layer 305 also extends underneath the die 106. The package leads 102 are attached to a side of the generally conductive layer 305 that is opposite the side to which the heat sink 101 is attached. The inner ends 102a of the package leads 102 do not extend to the interior edge 305a of the generally conductive layer 305 since some area must be left on the generally conductive layer 305 for bonding locations 312. Bond wires 109 are used to connect bonding locations 312 to selected ones of the package leads 102 or bond pads 109 on the die 106. Likewise, bond wires 107 are used to connect bonding locations 111 on the heat sink 101 to selected ones of the package leads 102 or bond pads 109 on the die 106.

In the embodiment of the invention shown in FIGS. 3A and 3B, dielectric layer 303 is disposed between the generally conductive layer 305 and the package leads 102, and dielectric layer 304 is disposed between the generally conductive layer 305 and heat sink 101. Each of the dielectric layers 303, 304 is attached with an adhesive, such as an epoxy resin, to the heat sink 101, package leads 102 or generally conductive layer 305 as appropriate. The dielectric layers 303 and 304 electrically isolate the generally conductive layer 305 from the package leads 102 and heat sink 101, respectively.

The dielectric layers 303, 304 need not be present. The generally conductive layer 305 may be attached to each of the package leads 102 and heat sink 101 with an electrically insulative adhesive. An epoxy or polyimide adhesive may be used.

The interior edge 303a of the dielectric layer 303 extends beyond the inner ends 102a of the package leads 102. This is done to compensate for tolerances in positioning of the dielectric layer 303 and package leads 102 with respect to one another that may otherwise allow contact (and, thus, electrical shorting) between the package leads 102 and generally conductive layer 305.

Figure 4A:
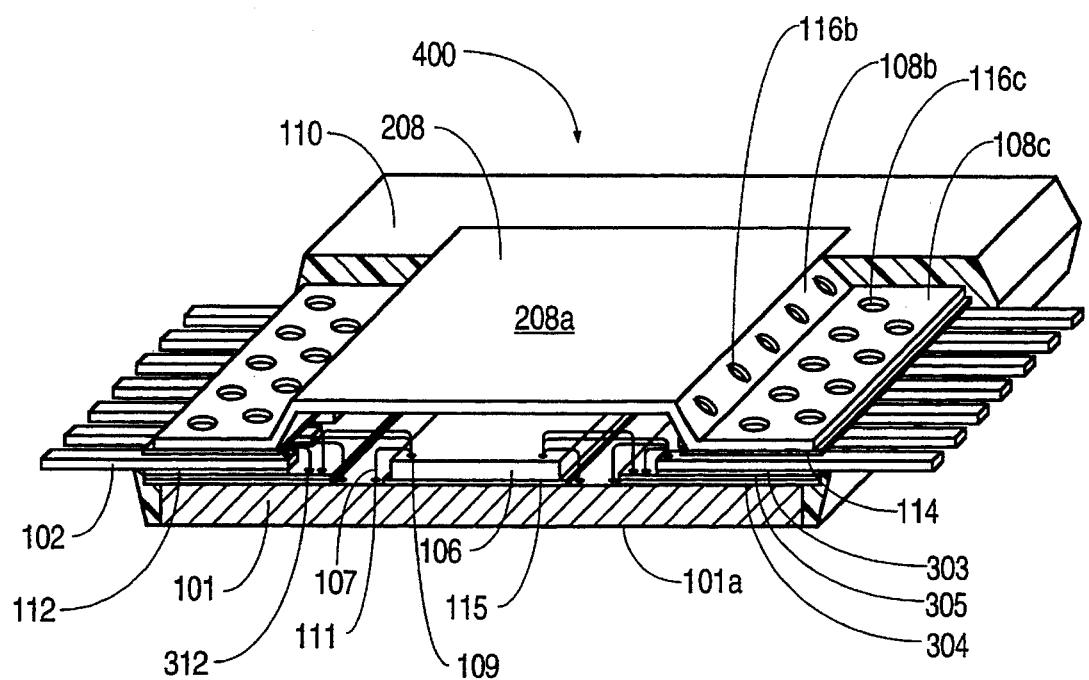
FIGS. 4A and 4B are a cutaway perspective view and a cross-sectional view, respectively, of a packaged integrated circuit according to another embodiment of the invention.
Figure 4B:
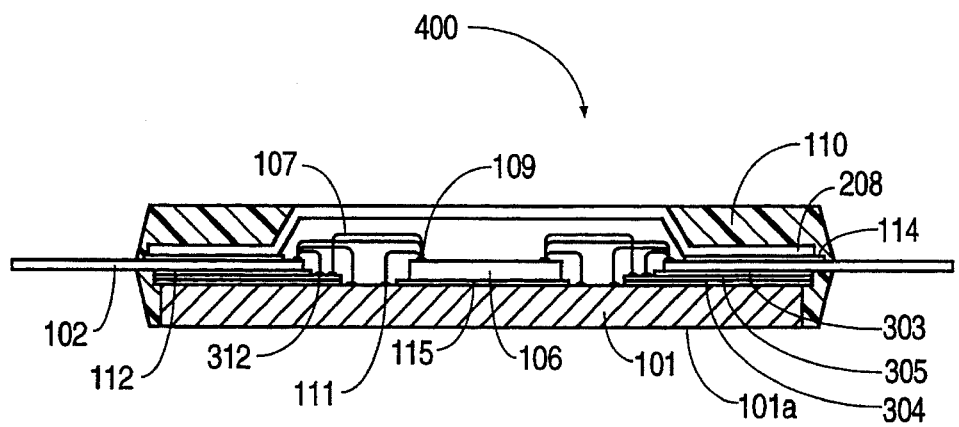

FIGS. 4A and 4B are a cutaway perspective view and a cross-sectional view, respectively, of a packaged integrated circuit 400 according to another embodiment of the invention. The packaged integrated circuit 400 is similar to the packaged integrated circuit 200 and like elements in the packaged integrated circuits 200 and 400 are indicated with the same numbers. In the packaged integrated circuit 400, the generally conductive layer 305 has been added to the packaged integrated circuit 200 of FIGS. 2A and 2B. The attachments between the generally conductive layer 305 and other elements of the packaged integrated circuit 400 are as described above with respect to FIG. 3.

The embodiments of the invention of FIGS. 3A, 3B, 4A and 4B include a single generally conductive layer. It is to be understood that the invention encompasses integrated circuits that include more than one generally conductive layer. In other embodiments, generally conductive layers can be used either between the package leads and heat sink, or between the package leads and thermal induction plate. Additional dielectric layers may be provided to electrically isolate each additional generally conductive layer from the other generally conductive layers, the heat sink, the thermal induction plate, or the package leads, as appropriate. As above, adhesive is used to attach each of the additional generally conductive and dielectric layers to adjacent layers. Also as above, alternatively, the separate dielectric layers need not be used and the generally conductive layers may be attached with an electrically insulative adhesive (which creates a dielectric layer) to other generally conductive layers, the heat sink, the thermal induction plate or the package leads. Practically, the number of generally conductive layers is limited by the increasing thickness of the packaged integrated circuit that results as the number of generally conductive layers increases.

Figure 4C:
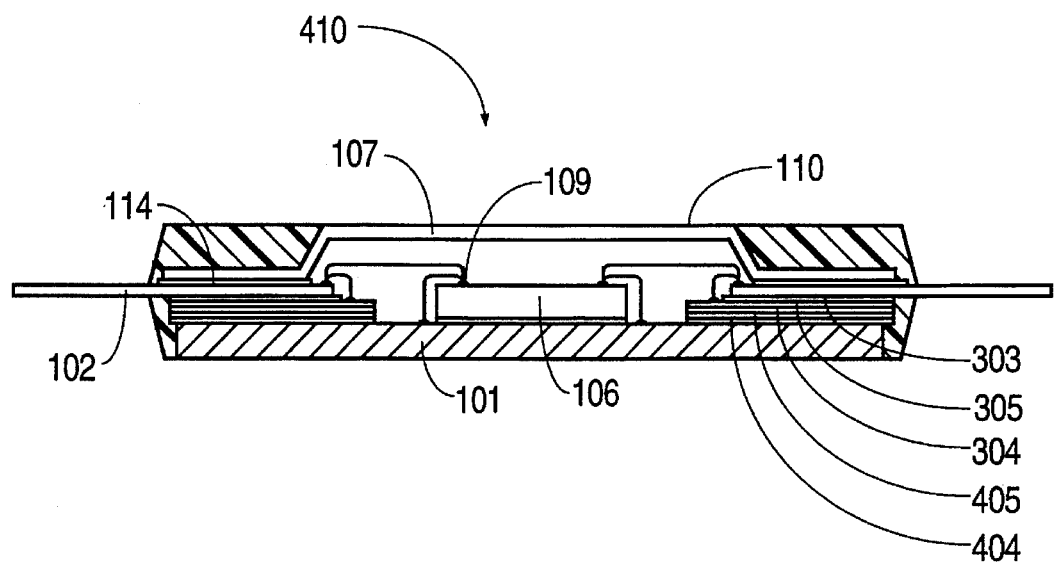
FIGS. 4C and 4D are cross-sectional views of packaged integrated circuits according to additional embodiments of the invention.
Figure 4D:
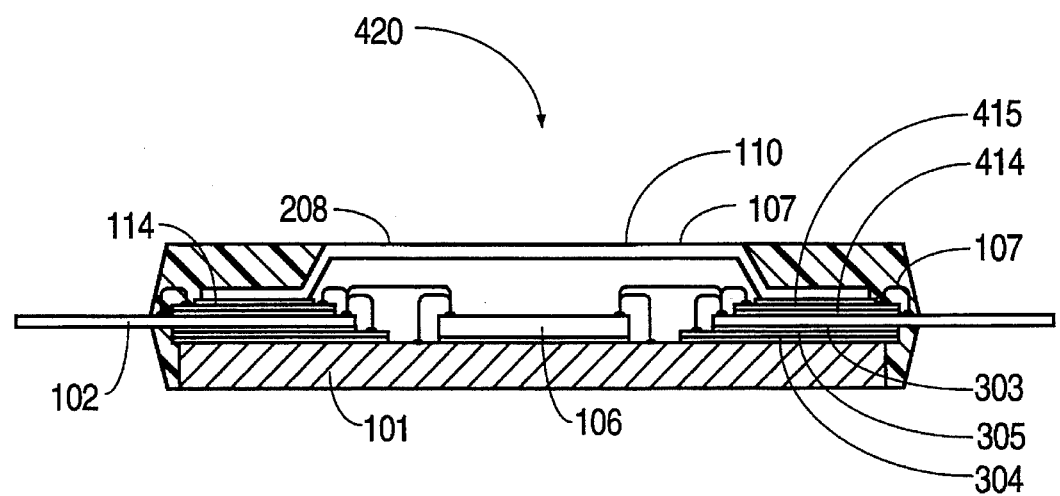

FIGS. 4C and 4D are cross-sectional views of packaged integrated circuits 410 and 420 according to additional embodiments of the invention. In FIG. 4C, generally conductive layer 405 and dielectric layer 404 have been added between dielectric layer 304 and heat sink 101. In FIG. 4D, dielectric layer 414 and generally conductive layer have been added between package leads 102 and thermal induction plate 208.

Though in the embodiments of FIGS. 3A, 3B, 4A, 4B, 4C and 4D the generally conductive layer 305 is connected to the package leads 102 and the die 106 with bond wires 107, other means of making electrical connection can be used. For instance, a conductive epoxy (such as a silver filled epoxy) can be used to attach certain package leads 102 to the generally conductive layer 305 such that the package leads 102 are electrically connected to desired regions of the generally conductive layer 305. Additionally, through holes can be formed in the dielectric layer 303 and plated with an electrically conductive material to form electrical connection between selected package leads 102 and selected locations on the generally conductive layer 305.

Further, electrical connection between the generally conductive layer and other components of the packaged integrated circuit need not be made. Generally conductive layers, e.g., generally conductive layer 305, can be provided in packaged integrated circuits according to the invention, e.g., packaged integrated circuits 300 and 400, without electrically connecting the generally conductive layer to other electrically conductive material within the packaged integrated circuit. Such a generally conductive layer could act as, for instance, a floating electrical plane. Even without electrical interconnection, the generally conductive layer still provides electrical benefits such as reduction of package lead mutual inductance.

Though, in the embodiments of FIGS. 3A, 3B, 4A, 4B, 4C and 4D, the generally conductive layer or layers are shown formed around the periphery of the semiconductor die, it is to be understood that one or more of the generally conductive layers can be formed to extend underneath the die.

Figure 4E:
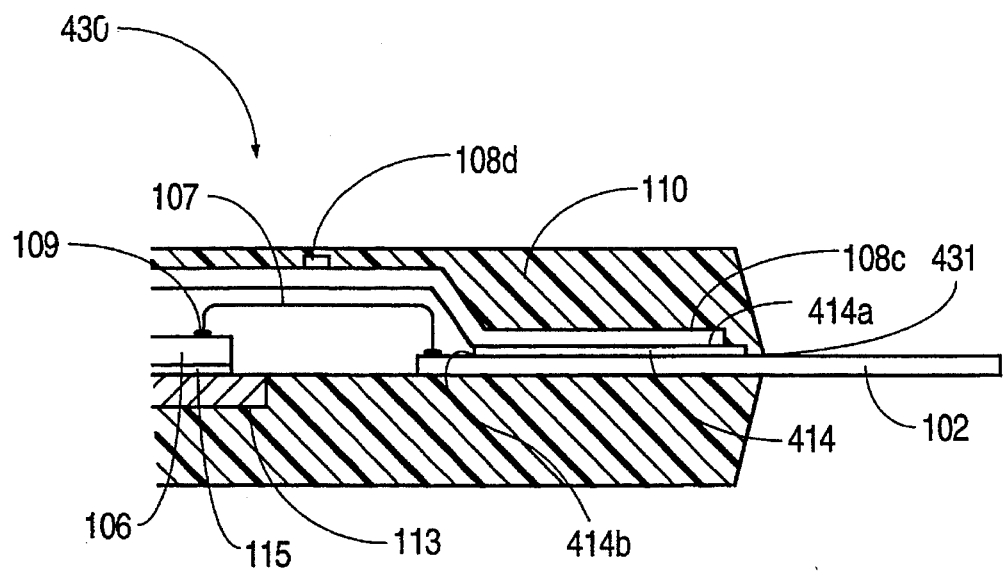
FIGS. 4E and 4F are cross-sectional views of a right-hand portion of packaged integrated circuits according to further embodiments of the invention.
Figure 4F:
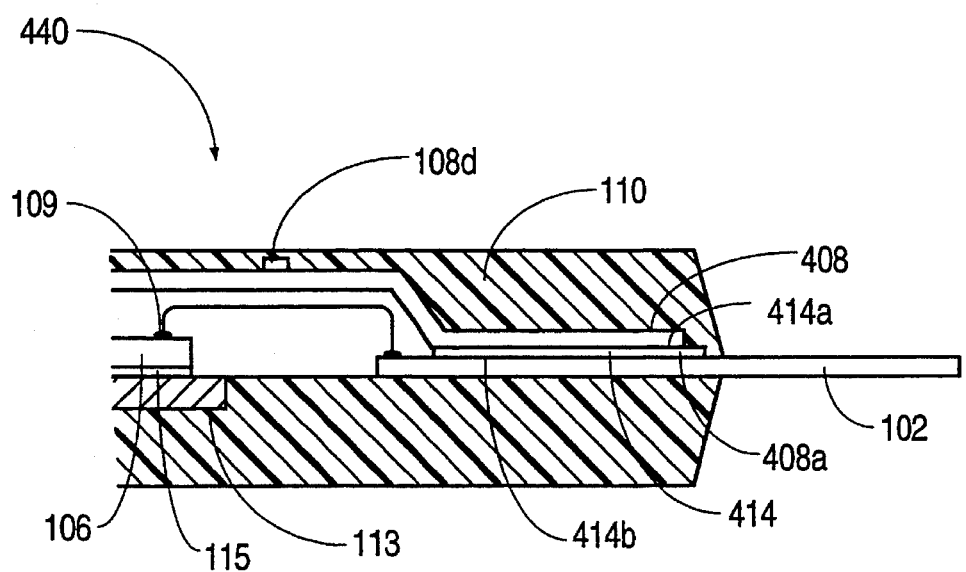

FIGS. 4E and 4F are cross-sectional views of a portion of packaged integrated circuits 430 and 440, respectively, in which the thermal induction plate 108 or 408, respectively is electrically connected to selected package leads 102. In these embodiments, the thermal induction plate can be, for instance, a ground plane or power plane. In FIGS. 4E and 4F, packaged integrated circuits 430 and 440, respectively, are similar to packaged integrated circuit 150 of FIGS. 1C and 1D, and like elements are designated by the same numerals. In both packaged integrated circuits 430 and 440, adhesive 414 attaching package leads 102 to thermal induction plate 108 is shorter than the corresponding adhesive 114 in packaged integrated circuit 150.

In packaged integrated circuit 430 (FIG. 4E), a ball bond 431 is formed, using conventional wirebonding equipment, on package leads 102 that are to be electrically connected to thermal induction plate 108. Ball bonds 431 are formed on the selected package leads 102 between edge 414a of the adhesive 414 and the edge of package 110.

In an alternative embodiment, adhesive 414 could be made shorter at edge 414b so that a surface of section 108c facing package leads 102 is exposed. Ball bonds 431 could then be formed on the selected package leads 102 adjacent edge 414b of adhesive 414.

In packaged integrated circuit 440 (FIG. 4F), thermal induction plate 408 is formed with dimples 408a at locations that are aligned with package leads 102 to which it is desired to make electrical connection. Dimples 408a can be formed by a punch and mating female die. As with ball bonds 431 of packaged integrated circuit 430, dimples 408a can be formed on either side of adhesive 414 with appropriate sizing of adhesive 414.

Though the embodiments of FIGS. 3A, 3B, 4A, 4B, 4C and 4D, as described above, all include a heat sink 101, it is to be understood that packaged integrated circuits according to the invention can be formed as in FIGS. 3A, 3B, 4A, 4B, 4C and 4D with the heat sink 101 omitted.

Figure 5A:
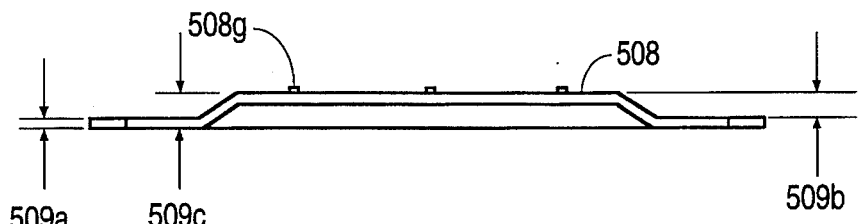
FIGS. 5A and 5B are a side view and plan view, respectively, of a thermal induction plate that can be used with the embodiments of the invention of FIGS. 1A, 1B, 1C, 1D, 3A and 3B.
Figure 5B:
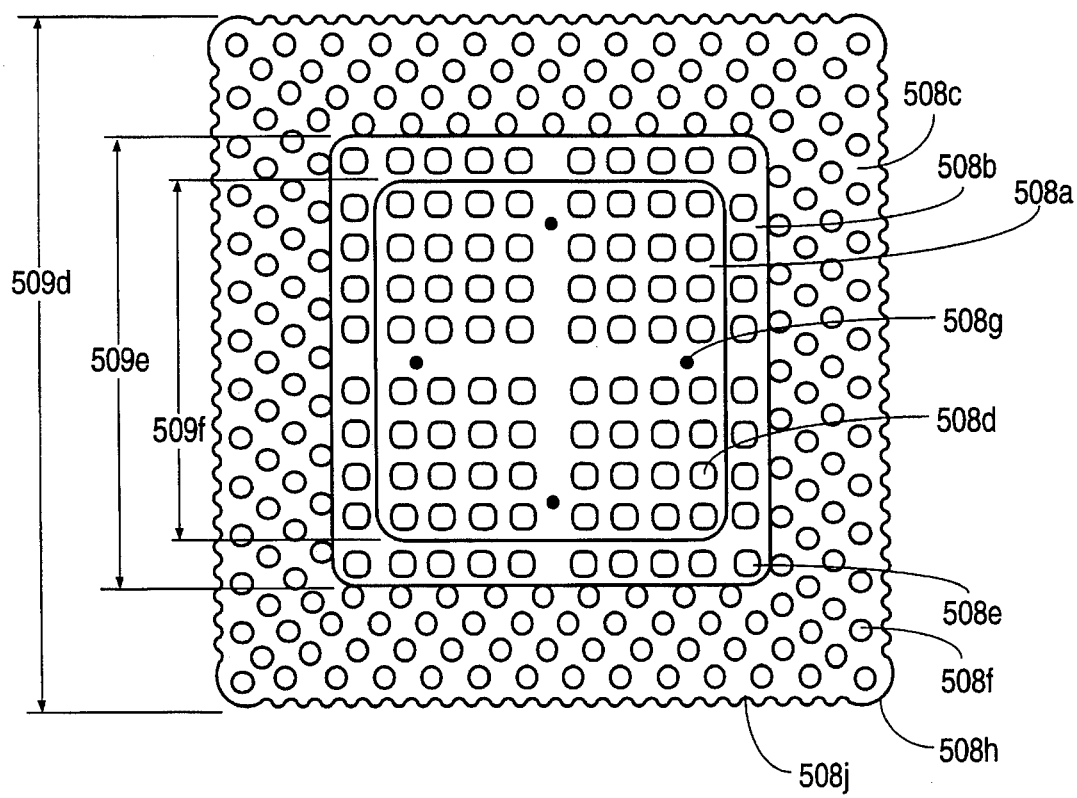

FIGS. 5A and 5B are a side view and plan view, respectively, of a thermal induction plate 508 that can be used with embodiments of the invention in which the only parts of the thermal induction plate 508 that are exposed to the exterior of the integrated circuit package are protrusions 508g. The dimensions 509a, 509b and 509c of the thermal induction plate 509 are 0.020 inches (0.50 mm), 0.0354 inches (0.90 mm) and 0.0634 inches (1.61 mm), respectively. The dimension 509c is measured to the end of the protrusions 508g.

Each of the sections 508a and 508c are rectangular. The dimensions 509d, 509e and 509f of the thermal induction plate 509 are 1.10 inches (27.9 mm), 0.772 inches (19.6 mm) and 0.693 inches (17.6 mm), respectively. The radius of curvature of the rounded corners 508h is 0.0846 inches (2.15 mm). The dimension 509d is measured from the outermost point of two corners 508h. The sides 508j are slightly recessed relative to the outermost point of the corners 508h so that the distance between the outermost points of the sides 508j is 1.08 inches (27.6 mm). The sides 508j are castellated so that, during formation of a packaged integrated circuit including the thermal induction plate 508 as described below with respect to FIG. 8, the package material can flow past the sides of the thermal induction plate 508.

The holes 508d formed through the section 508a have a diameter of 0.0354 inches (0.90 mm). The holes 508e formed through the section 508b have a diameter of 0.030 inches (0.76 mm). The holes 508f formed through the section 508c have a diameter of 0.030 inches (0.76 mm). The holes (in particular, holes 508e and 508f) are formed such that approximately equal amounts of thermal induction plate 508 remain above each package lead in the packaged integrated circuit for which the thermal induction plate 508 is intended, while providing for good flow of molding compound in and around the package leads without entrapment of air. Generally, the holes 508d, 508e, 508f are located and sized so that the thermal induction plate 508 will interact with other electrically conductive parts of the packaged integrated circuit (e.g., package leads, die, generally conductive layer) to provide the desired electrical characteristics.

The protrusions 508g have a height that is adequate to ensure that the thermal induction plate 508 will be covered with package material when encapsulated in a packaged integrated circuit. The exact height depends on the properties of the package material used. The protrusions 508g can be cylindrical, conical or any other desired shape. In FIG. 5, each of the protrusions 508g is formed on section 508a approximately midway along a side of section 508a; however, the protrusions 508g can be formed at any locations.

Figure 6A:
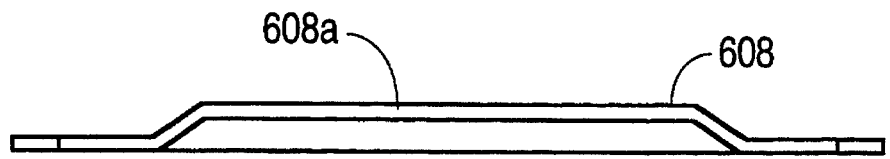
FIGS. 6A and 6B are a side view and plan view, respectively, of a thermal induction plate that can be used with the embodiments of the invention of FIGS. 2A, 2B, 2C, 2D, 4A and 4B.
Figure 6B:
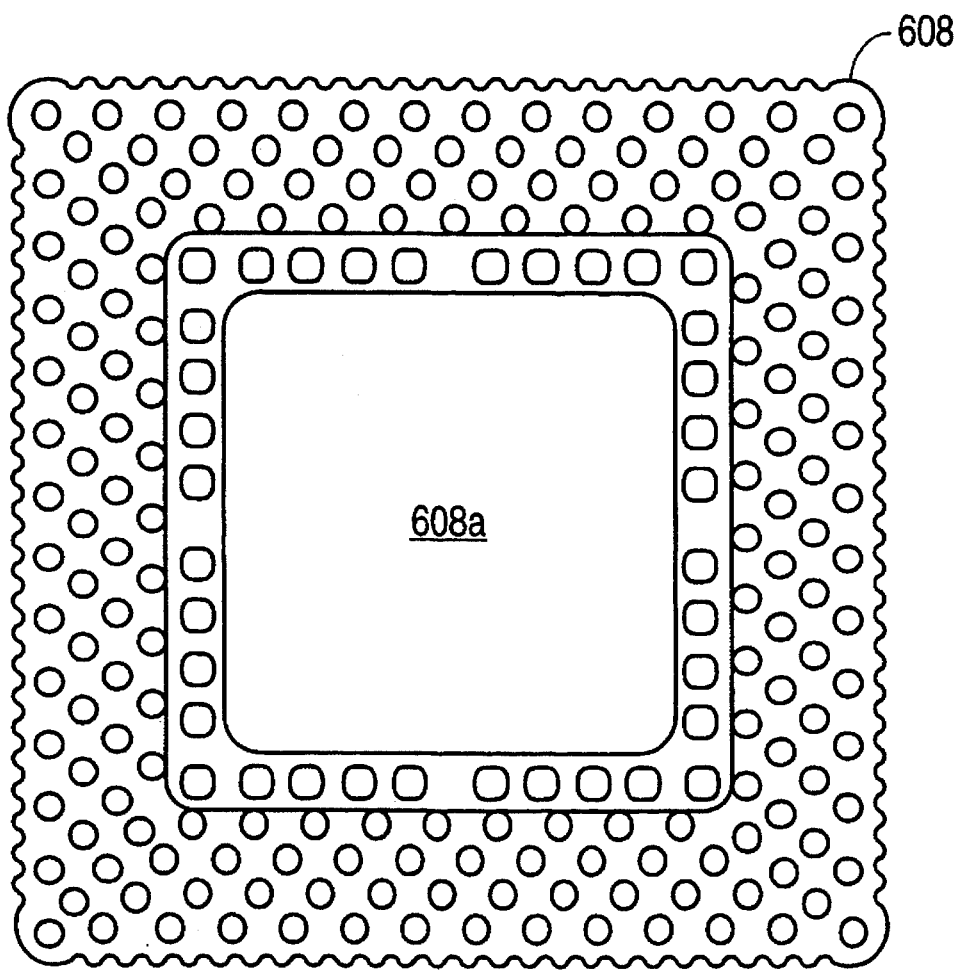

FIGS. 6A and 6B are a side view and plan view, respectively, of a thermal induction plate 608 that can be used with embodiments of the invention in which an entire surface of section 608a is exposed to the exterior of the integrated circuit package. Corresponding dimensions of the thermal induction plates 508 and 608 are the same, except that the dimension of the thermal induction plate 608 that corresponds to the dimension 509b is 0.0434 inches (1.10 mm). The dimension of the thermal induction plate 608 that corresponds to the dimension 509c of the thermal induction plate 509 is measured to the exposed surface of section 608a.

It is to be understood that the invention encompasses thermal induction plates having dimensions different than those given above for the thermal induction plates 508 and 608. For instance, the size, number and location of the holes may be varied, the size and shape of the sections may be varied, and the thicknesses of different sections and overall thickness of the thermal induction plate may be varied. Generally, thermal induction plates according to the invention are sized according to the particular mold cavity and package used. Further, the size, shape and location of the holes in the thermal induction plate involves a tradeoff between achieving good flow of the package material during formation of a packaged integrated circuit according to the invention, as described below, maintaining a large area of metal to provide better thermal and electrical characteristics, and providing adequate strength to withstand stress.

Packaged integrated circuits 100, 200, 300 and 400 according to embodiments of the invention including a heat sink 101 dissipate heat particularly effectively. The adhesive 115 used to attach the die 106 to the heat sink 101 is relatively thin and thermally conductive; therefore, the adhesive 115 does not represent a significant thermal barrier to the transfer of heat from the die 106 to the heat sink 101. The close connection between the die 106 and heat sink 101 allows a large amount of heat to be transferred from the die 106 to the heat sink 101. This heat is then conducted through the heat sink 101 and convected and radiated away from the packaged integrated circuit 100, 200, 300 or 400 at the surface 101a of the heat sink 101 exposed to the exterior of the package 110, or conducted through the package leads 102 to the exterior of the package 120. The exposed heat sink surface 101a allows heat to be transferred from the heat sink 101 away from the packaged integrated circuit 100, 200, 300 or 400 better than would be the case if relatively thermally insulative package material covered the heat sink surface 101a, impeding the transfer of heat from the packaged integrated circuit 100, 200, 300 or 400.

Further, the thermal induction plate 108 or 208 aids in the transfer of heat away from the die 106. Heat is transferred to the package leads 102 from the die 106 through the bond wires 107 and, in the packaged integrated circuits 100 and 200, through the heat sink 101. Some of this heat is then transferred to the thermal induction plate 108 or 208 (the remainder is transferred through the package leads 102 to the exterior of the package 110). The heat transferred to the thermal induction plate 108 or 208 is conducted through the thermal induction plate 108 or 208. This heat is then convected and radiated away from the exposed surface of section 208a of the thermal induction plate 208 in packaged integrated circuits 200, 250 and 400. In packaged integrated circuits 100, 150 and 300, this heat is convected and radiated away from the protrusions 108d exposed to the exterior of the package 110, or it is conducted through the relatively thin layer of package material lying between the thermal induction plate 108 and the exterior of the package 110, then convected and radiated away from the packaged integrated circuit 100, 150 or 300.

In addition to good thermal characteristics, packaged integrated circuits according to the invention, e.g., packaged integrated circuits 100, 150, 200, 250, 300 and 400, have enhanced electrical performance as compared to previous packaged integrated circuits. The presence of the thermal induction plate 108 or 208 in proximity to the package leads 102 causes mutual inductance between the package leads 102 and thermal induction plate 108 or 208, resulting in a reduction of inductance in signal paths (particularly power and ground paths), thereby reducing switching noise in the packaged integrated circuits 100, 150, 200, 250, 300 and 400. The presence of the thermal induction plate 108 or 208 also reduces the capacitive coupling between adjacent signal paths in the packaged integrated circuits 100, 150, 200, 250, 300 and 400, thereby reducing crosstalk.

Further, in the packaged integrated circuits 300 and 400, the generally conductive layer 305 can be used to provide a ground plane, power plane, signal routing, or some combination of these functions. Consequently, the packaged integrated circuits 300 and 400 have a high degree of flexibility in electrical design and reduced electrical noise as compared to previous packaged integrated circuits. For instance, provision of power and/or ground planes on the generally conductive layer 305 enables uniform power and ground supplies to be provided to the circuitry formed on the die 106. The presence of the generally conductive layer 305 reduces the inductance of package leads 102, which results in a reduction of electrical noise. The power and ground planes also provide decoupling capacitances that reduce switching noise and crosstalk. Provision of signal routing on the generally conductive layer 305 allows increased flexibility in signal routing for single chip packaged integrated circuits 100, 200, 300 or 400 and may be used for connecting chips and passive components in multichip or hybrid modules.

Finally, in addition to acting as a heat dissipation device, the heat sink 101 in packaged integrated circuits 100, 150, 200, 250, 300 and 400 can also perform an electrical function. For instance, the heat sink 101 may be used as a ground or power plane. If the heat sink 101 performs an electrical function in the packaged integrated circuit 100, 150, 200, 250, 300 or 400, bonding locations 111 on the heat sink 101 are electrically connected to one or more bond pads 109 on the die 106, or one or more package leads 102.

Integrated circuits according to the invention may be formed using any of a number of well-known techniques. Below, an illustrative method for constructing an integrated circuit according to the invention is briefly described.

Figure 7A:
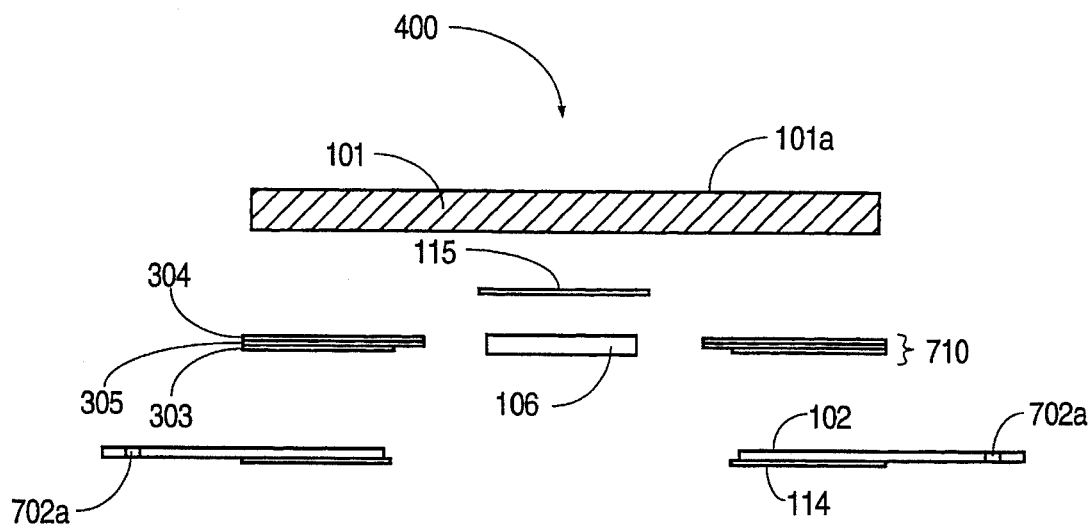
FIG. 7A is an exploded cross-sectional view of a partially packaged integrated circuit according to the invention.

FIG. 7A is an exploded cross-sectional view of a partially packaged integrated circuit 400. The partially packaged integrated circuit 400 includes a semiconductor die 106, a heat sink 101, package leads 102 of a leadframe, and a "sandwich" 710 including generally conductive layer 305 assembled between dielectric layers 303 and 304. The sandwich 710 is formed with a rectangular hole in its center so that in the packaged integrated circuit 400, the sandwich 710 surrounds the periphery of the semiconductor die 106.

The sandwich 710 may be formed in the following manner. Dielectric layers 303 and 304, made of, for instance, polyimide, are coated with adhesive, such as epoxy resin, by, for instance, roll coating. Alternatively, as is commonly done, the dielectric layers 303, 304 can be purchased from a vendor with adhesive, such as epoxy adhesive, already applied to both sides of the dielectric layers 303, 304.

The generally conductive layer 305 is placed on the dielectric layer 304 such that an adhesive-coated side of the dielectric layer 304 faces the generally conductive layer 305. While heat is applied, the dielectric layer 304 and generally conductive layer 305 are squeezed together by, for instance, a mechanical press. The application of heat causes the adhesive to become tacky. The dielectric layer 304 and generally conductive layer 305 are allowed to cool to room temperature, solidifying the adhesive and bonding the dielectric layer 304 to the generally conductive layer 305.

In one embodiment, a desired pattern is etched and a hole is punched through the dielectric layer 304 and generally conductive layer 305. In an alternative embodiment, the hole is stamped using a conventional punch. A larger hole is formed through the dielectric layer 303. The dielectric layer 303 is aligned, then attached to the generally conductive layer 305 in the manner described above for the dielectric layer 304 and generally conductive layer 305.

Note that conductive regions and paths could be formed on (additive process), or etched from (substractive process), the generally conductive layer 305 either before the attachment of the generally conductive layer 305 to the dielectric layers 303, 304 or after the attachment of the dielectric layer 304. If after, the electrically conductive traces and regions would, of course, be formed on, or etched from, the surface of the generally conductive layer 305 not attached to the dielectric layer 304.

The dielectric layer 304 of the sandwich 710 is attached to the heat sink 101, the package leads 102 of the leadframe are attached to the dielectric layer 303 of the sandwich 710, and the semiconductor die 106 is attached to the heat sink 101 with adhesives. The adhesives bond the heat sink 101, sandwich 710, die 106 and leadframe by being heated to become tacky, then cooled to solidify. Each of the attachments—sandwich 710 to heat sink 101, package leads 102 to sandwich 710, die 106 to heat sink 101—could be performed simultaneously or sequentially (one at a time or two at a time) in a desired order. In one embodiment of the invention, the sandwich 710 is attached to the package leads 102 and the heat sink 101, then the die 106 is attached to the heat sink 101.

Figure 7B:
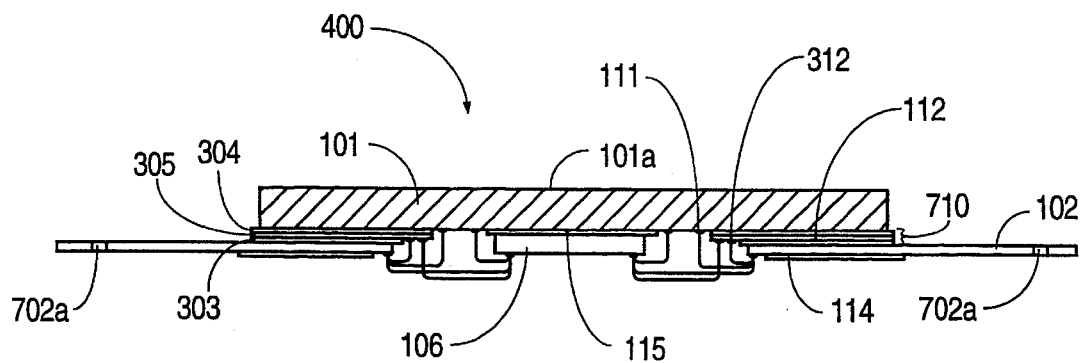
FIG. 7B is a cross-sectional view of the assembled partially packaged integrated circuit of FIG. 7A.

Selected package leads 102 are bonded using conventional wirebonding techniques to bond pads on the die 106, bonding locations 312 on the generally conductive layer 305, or bonding locations 111 on the heat sink 101, respectively. Likewise, selected bond pads on the die 106 are bonded to package leads 102, bonding locations 312 on the generally conductive layer 305, or bonding locations 111 on the heat sink 101, respectively. Alternatively, other die interconnection technologies, such as TAB, can be used. The partially packaged integrated circuit 400, as assembled at this point, is shown in FIG. 7B.

Figure 8:
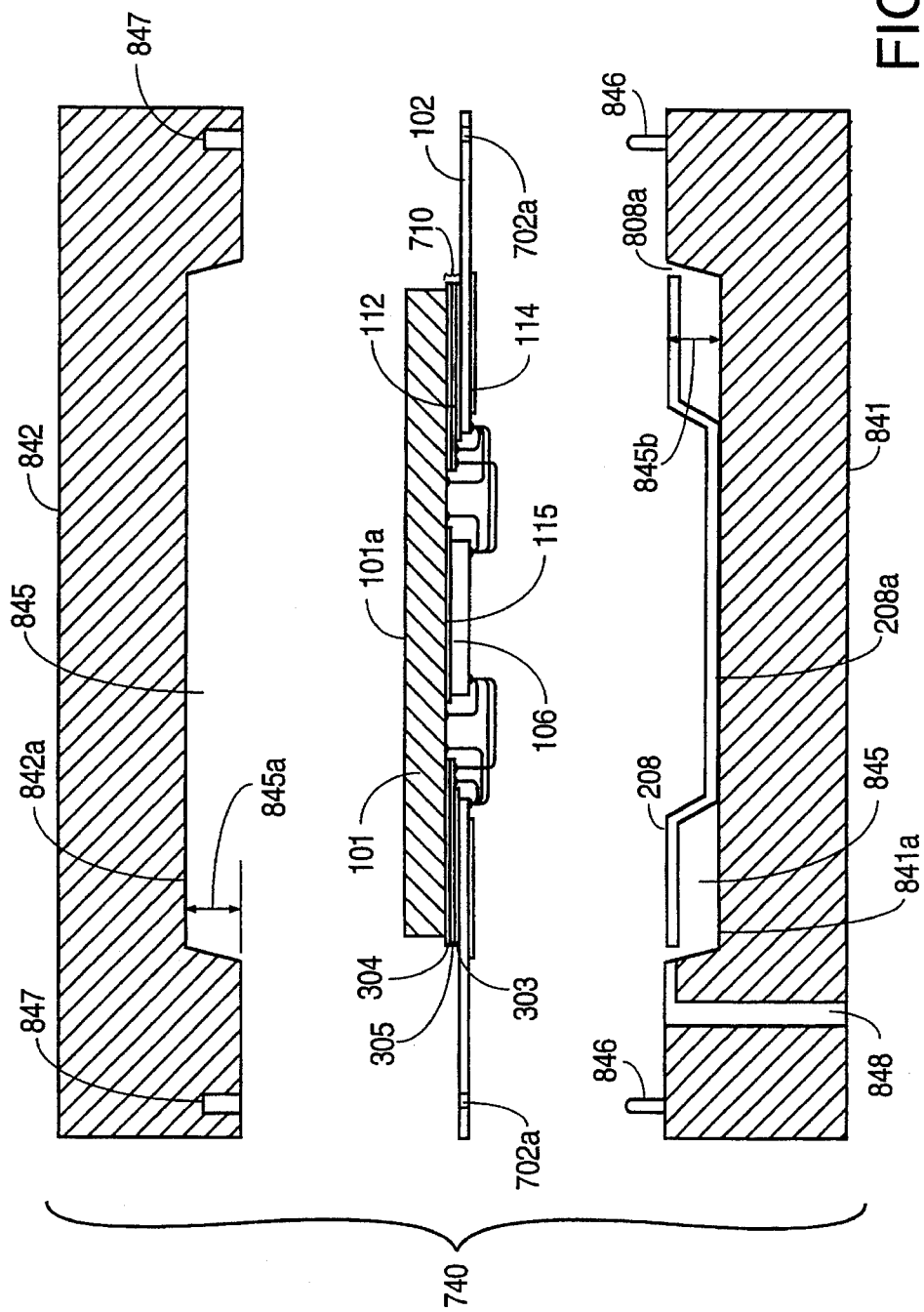
FIG. 8 is a cross-sectional view of the assembled partially packaged integrated circuit of FIG. 7B disposed in a mold cavity of a mold assembly that is used to produce a packaged integrated circuit.

FIG. 8 is a cross-sectional view of the partially packaged integrated circuit 400 disposed in a mold cavity 845 of a mold assembly 840 that is used to produce a packaged integrated circuit. The thermal induction plate 208 (the holes in thermal induction plate 208 are not shown to increase the clarity of FIG. 8) is dropped into the mold cavity 845 so that a surface of section 208a contacts the surface 841a of the mold half 841. (If the packaged integrated circuits 100, 150 or 300 were being produced, the protrusions 108d of the thermal induction plate 108 would contact the surface 841a.) Since the dimensions of the thermal induction plate 208 (measured in a plane parallel to the surface 841a extending between the edges 808a of the thermal induction plate 208) are just slightly less (e.g., 0.012 inches (0.3 mm)) than the corresponding dimensions of the cavity 845, the thermal induction plate 208 self-aligns within the mold cavity 845. This self-alignment allows use of the drop-in technique for disposing the thermal induction plate 208 within the mold cavity 845. For electrical isolation of the thermal induction plate 208 from the package leads 102, a dielectric and/or adhesive is placed between the thermal induction plate 208 and the package leads 102 by pre-attaching to either the thermal induction plate 208 or the package leads 102. The partially packaged integrated circuit 400 is disposed within the mold cavity 845 on top of the thermal induction plate 208 and is located and held in place by pins 846 formed on the mold half 841 that fit through holes 702a formed at intervals in the frame of the leadframe.

Alternatively, if desired or if the dimensions of the thermal induction plate 208 are sufficiently small so that the thermal induction plate 208 may move around an unacceptable amount within the mold cavity 845, the thermal induction plate 208 may be attached to the package leads 102 prior to being inserted into the mold cavity 845.

After the partially packaged integrated circuit 400 is mounted in the mold cavity 845, the two mold halves 841 and 842 are brought together. Just prior to closure of the mold 840, the surface 842a of the mold half 842 contacts the surface 101a of the heat sink 101. The combined thickness of the heat sink 101, dielectric layers 303 and 304, and generally conductive layer 305 is intentionally made slightly greater than the dimension 845a of the upper half of the mold cavity 845. As a result, the closing motion of the mold half 842 forces the combination of the heat sink 101, dielectric layers 303 and 304, and generally conductive layer 305 downward just prior to mold closure. Since the package leads 102 are held in place by the pins 846, this downward motion causes the inner portions of the package leads 102 to bend slightly downward. This bending of the package leads 102 gives rise to tensile forces in the package leads 102 that act to counteract the movement of the heat sink 101, dielectric layers 303 and 304, and generally conductive layer 305, and maintain contact between surface 101a of heat sink 101 and mold surface 842a. The bent package leads 102 also force the surface of section 208a of the thermal induction plate 208 against the mold surface 841a.

When the mold assembly 840 is fully closed, encapsulant is pressure fed by, for instance, transfer molding or injection molding, into the mold cavity 845 until the cavity 845 is full. The encapsulant is fed into the cavity 845 through the channel 848 in a method known as bottom side gating. Other gating methods could be used for transferring encapsulant into the mold cavity 845, e.g., gang pot, top plane gating, bottom plane gating. After the mold cavity 845 is filled with encapsulant, the encapsulant is allowed to cool and solidify. The mold assembly 840 is then opened and the packaged integrated circuit 400 removed.

The presence of the holes 116b and 116c in the thermal induction plates 108 and 208 allow encapsulant to flow past the thermal induction plate 108 or 208 to the area around the die 106 so that cavities do not form in the hardened encapsulant. Additionally, the hardening of the encapsulant through the holes 116b and 116c locks the package 110 to the remainder of the packaged integrated circuit 100, 150, 200, 250, 300 or 400 better than would otherwise be the case. In packaged integrated circuits 100, 150 and 300 in which the thermal induction plate 108 is used, the additional holes 116a in the thermal induction plate 108 further aid encapsulant flow to the region around the die 106 and provide additional locking of the encapsulant to the rest of the packaged integrated circuit 100, 150 or 300.

Since, as explained above, a good seal is maintained between the heat sink surface 101a and the mold cavity surface 842a, and between the surface of the thermal induction plate section 208a and the mold cavity surface 841a, during the encapsulation process, encapsulant bleed (the undesirable presence of translucent encapsulant) or encapsulant flash (the undesirable presence of encapsulant greater in thickness than bleed and visible to the naked eye) are minimized. Thus, the heat sink surface 101a and the surface of the thermal induction plate section 208a remain exposed after packaging of the integrated circuit 400. Any encapsulant bleed or flash that does form on these surfaces may be removed using conventional cleaning techniques.

At this point, outer portions of the package leads 102 extend outside the package and are connected to each other by the frame of the leadframe. The package leads 102 are physically separated by removing the portions of the frame between package leads 102. The individual package leads 102 may then be bent, if desired, into a position that allows surface mounting of the packaged integrated circuit 400.

Various embodiments of the invention have been described. The descriptions are intended to be illustrative, not limitative. Thus, it will be apparent to one skilled in the art that certain modifications may be made to the invention as described without departing from the scope of the claims set out below. For instance, though the above embodiments of the invention are described with respect to an integrated circuit including a single semiconductor die, it is to be understood that the invention also encompasses integrated circuits including a plurality of semiconductor die. Further, each integrated circuit according to the invention may have package leads or exterior package connections extending from any number of sides of the package or, more generally, in any manner from the exterior of the package.

I claim:

1. An integrated circuit package, comprising:

a semiconductor die, the die having a first surface, electrically conductive circuitry on said first surface and a plurality of electrically conductive bond pads positioned at peripheral edges of the first surface;

a plurality of electrically conductive package leads for transmitting electrical signals to and from the integrated circuit, each package lead having a first surface and a second surface opposite the lead first surface, each of the leads having an inner portion spaced from and juxtaposed to respective ones of said bond pads;

a thermal induction plate including a first planar section extending in a band overlying the inner portions of the plurality of the package leads and having a band first surface positioned immediately adjacent to and electrically isolated from said inner portions of the first surface of the each of the package leads;

means for making electrical connection between selected package leads and selected juxtaposed bond pads on the die;

said thermal conduction plate having a second planar section and a first surface overlying and spaced from said die first surface, said bond pads and said means for making electrical connection;

a molded electrical insulative encapsulant encapsulating the semiconductor die, the inner portions of the package leads, the thermal induction plate and the means for making electrical connection to form an encapsulated package; and wherein said thermal induction plate extends substantially coextensive with the encapsulated package and such that said thermal induction plate reduces electrical noise, crosstalk and radiated electromagnetic energy from said circuitry.

2. An integrated circuit package as in claim 1, wherein a second surface of the thermal induction plate opposite said second planar section first surface extends exposed to an ambient environment at an exterior surface of the encapsulated package.

3. An integrated circuit package as in claim 1, further comprising a heat sink, wherein:

a second surface of the die opposite the first surface of the die is attached to a first surface of the heat sink; and an inner portion of the second surface of each of the package leads is attached to the first surface of the heat sink by an electrically non-conductive adhesive.

4. An integrated circuit package as in claim 3, further comprising a plurality of bond wires, each bond wire making electrical connection between a bonding location on the heat sink and a location on at least one of the package leads and said bond pads.

5. An integrated circuit package as in claim 3, wherein a second surface of the heat sink extends exposed to an ambient environment at an exterior of the encapsulated package.

6. An integrated circuit package as in claim 5, wherein a second surface of the thermal induction plate extends exposed to an ambient environment at an exterior surface of the encapsulated package.

7. An integrated circuit package as in claim 3, wherein a second surface of the thermal induction plate extends exposed to an ambient environment at an exterior surface of the encapsulated package.

8. An integrated circuit package as in claim 1, wherein a plurality of holes are formed through the thermal induction plate.

9. An integrated circuit package as in claim 1, wherein peripheral edges of the thermal induction plate are castellated.

10. An integrated circuit package as in claim 1, wherein the first planar section of said thermal conduction plate extends substantially to peripheral sidewalls of said encapsulated package; and an angular section connects the first planar section and said second planar section, said second planar section being parallel to said first planar section.

11. An integrated circuit package as in claim 1, wherein the means for making electrical connection comprises a plurality of electrically conductive bond wires, each bond wire making electrical connection between one of the package leads and one of the bond pads.

12. An integrated circuit package as in claim 1, wherein the band overlying the inner portions of the plurality of leads extends peripherally around said die and further including means for connecting said first planar section and said second planar section of said thermal conduction plate.

13. An integrated circuit package as in claim 1 further, comprising:

a first electrically conductive layer spaced from said plurality of electrically conductive package leads and spaced from said thermal induction plate.

14. An integrated circuit as in claim 13, further comprising a heat sink, wherein a second surface of the die opposite the first surface of the die is attached to a surface of the heat sink.

15. An integrated circuit as in claim 14, further comprising a plurality of bond wires, the plurality of bond wires making electrical connection between selected ones of the package leads, bonding locations on the electrically conductive layer and bonding locations on the heat sink and the bond pads.

16. An integrated circuit as in claim 3, further comprising a second electrically conductive layer spaced from said first electrically conductive layer and said plurality of electrically conductive package leads.

17. An integrated circuit as in claim 16, wherein the first and second electrically conductive layers are located on opposite sides of the package leads.

18. An integrated circuit as in claim 16, wherein the first and second electrically conductive layers are located on the same side of the package leads.

* * * * *